(12) United States Patent
Miyai et al.

(10) Patent No.: US 7,781,255 B2
(45) Date of Patent: Aug. 24, 2010

(54) DONOR SHEET AND METHOD OF MANUFACTURING DONOR SHEET AND ORGANIC THIN FILM TRANSISTOR

(75) Inventors: Mitsuyoshi Miyai, Nara (JP); Masakazu Okada, Kyoto (JP)

(73) Assignee: Konica Minolta Holdings, Inc., Tokyo (JP)

( * ) Notice: Subject to any disclaimer, the term of this patent is extended or adjusted under 35 U.S.C. 154(b) by 54 days.

(21) Appl. No.: 11/901,923

(22) Filed: Sep. 19, 2007

(65) Prior Publication Data
US 2008/0076205 A1  Mar. 27, 2008

(30) Foreign Application Priority Data
Sep. 22, 2006  (JP)  ............... 2006-256925
Jul. 31, 2007   (JP)  ............... 2007-198706

(51) Int. Cl.
*H01L 21/368* (2006.01)
*H01L 51/48* (2006.01)
*H01L 51/56* (2006.01)

(52) U.S. Cl. .............. 438/99; 438/158; 438/502; 257/40; 257/E51.005

(58) Field of Classification Search ............ 438/99, 438/502, 497, 500, 158; 257/E51.005, 40, 257/E21.114, E21.118, E21.131, E21.464; 427/581, 901
See application file for complete search history.

(56) References Cited

U.S. PATENT DOCUMENTS
2005/0048691 A1*  3/2005  Bocian et al. ............... 438/99
2007/0012914 A1*  1/2007  Miura et al. ............... 257/40

FOREIGN PATENT DOCUMENTS
JP    2004-146575    5/2004

OTHER PUBLICATIONS
Chung, Wonsuk, Thompson, Michael O., Wickboldt, Paul, Toet, Daniel and Carey, Paul G., "6.4: Crystallization of Ultra-low Temperature ITO by XeCl Excimer Laser Annealing," SID 02 Digest, 2002, pp. 57-59.

* cited by examiner

*Primary Examiner*—Julio J Maldonado
(74) *Attorney, Agent, or Firm*—Brinks Hofer Gilson & Lione

(57) ABSTRACT

A method of manufacturing a donor sheet for transferring a transfer layer having a prescribed shape onto a receiving substrate, wherein: a step for forming an organic semiconductor precursor wherein a solution in which the organic semiconductor precursor which converts to an organic semiconductor due to heat, is coated on a substrate sheet; a step for forming a transfer layer of a prescribed shape by heating the organic semiconductor precursor layer in the prescribed shape to convert the organic semiconductor precursor layer to the organic semiconductor; and a step for removing the organic semiconductor precursor that is not converted to the organic semiconductor are performed in that order.

8 Claims, 5 Drawing Sheets

FIG. 1 (1a)
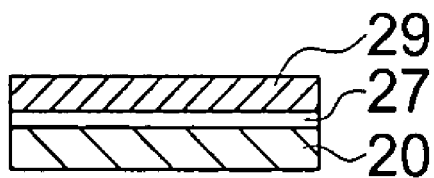
FIG. 1 (1b)
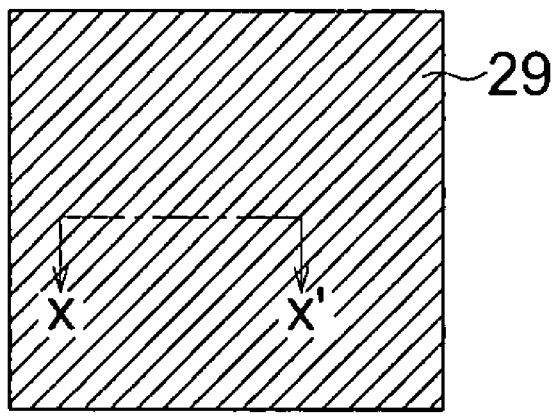
FIG. 1 (2a)
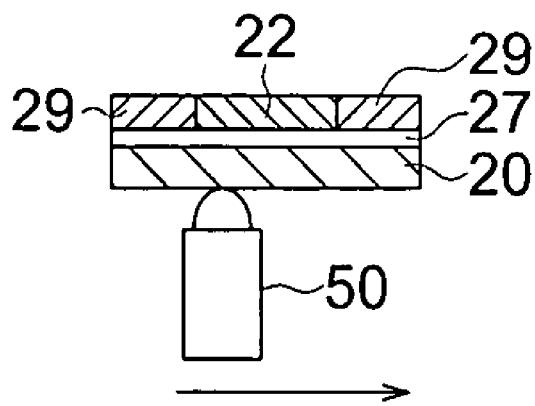
FIG. 1 (2b)
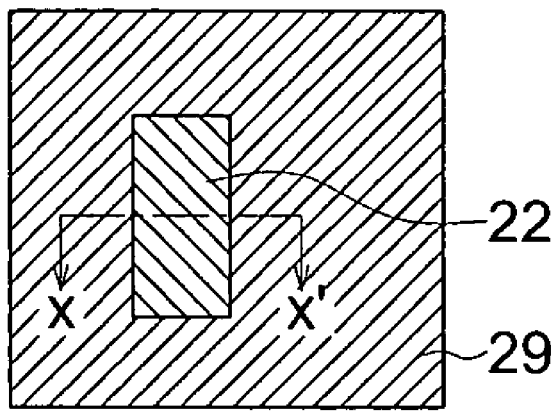
FIG. 1 (3a)
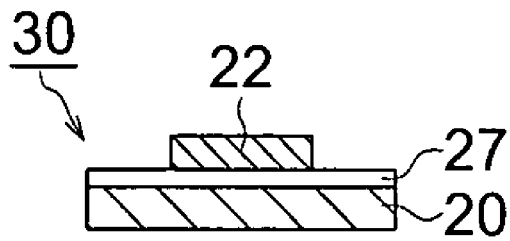
FIG. 1 (3b)
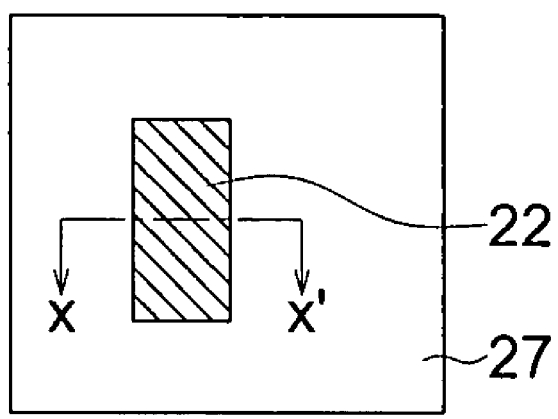

FIG. 2 (1a)
FIG. 2 (1b)
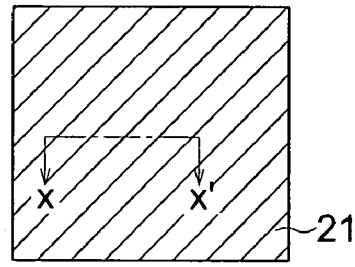
FIG. 2 (2a)
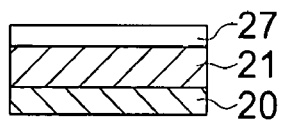
FIG. 2 (2b)
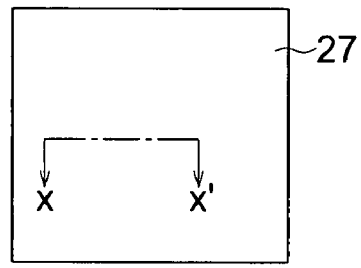
FIG. 2 (3a)
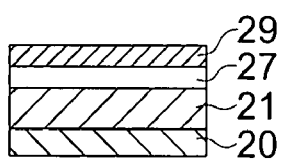
FIG. 2 (3b)
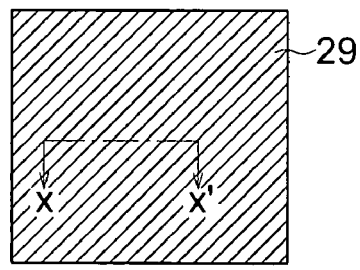
FIG. 2 (4a)
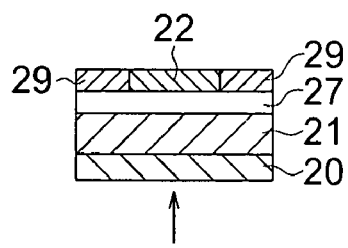
FIG. 2 (4b)
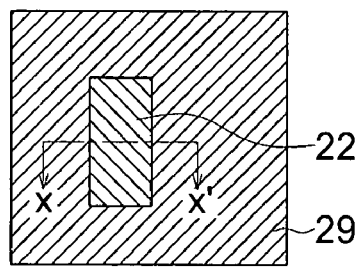
FIG. 2 (5a)
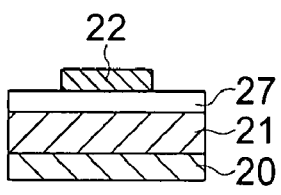
FIG. 2 (5b)
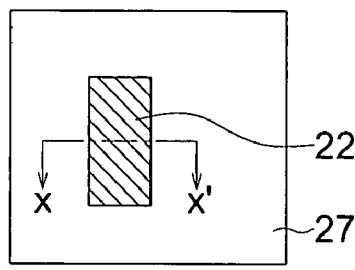

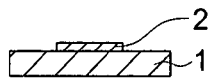
FIG. 3 (1a)
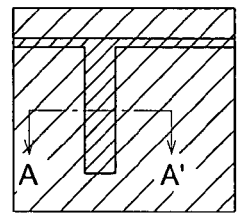
FIG. 3 (1b)
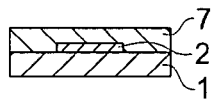
FIG. 3 (2a)
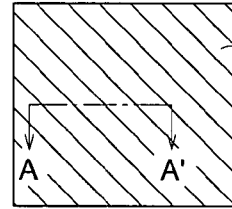
FIG. 3 (2b)
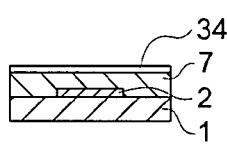
FIG. 3 (3a)
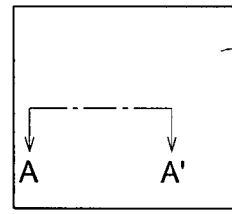
FIG. 3 (3b)
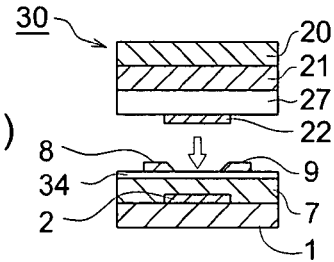
FIG. 3 (4a)
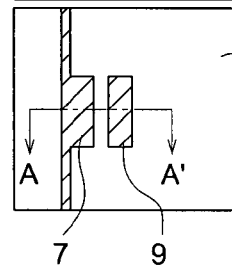
FIG. 3 (4b)
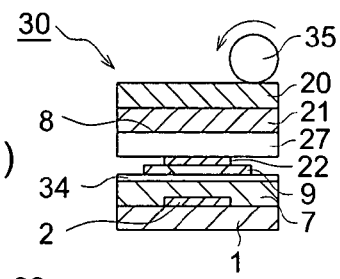
FIG. 3 (5a)
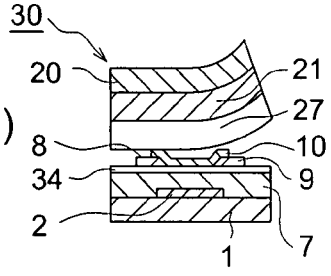
FIG. 3 (6a)
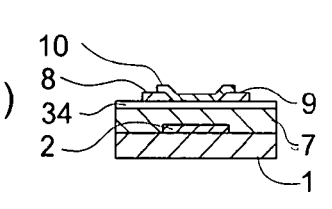
FIG. 3 (7a)
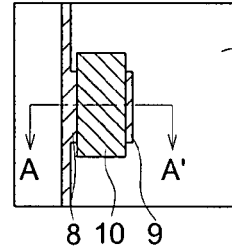
FIG. 3 (7b)

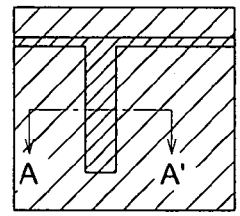
FIG. 6 (1a)  FIG. 6 (1b)
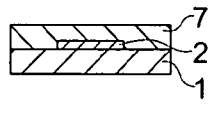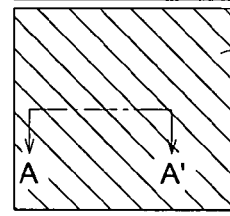
FIG. 6 (2a)  FIG. 6 (2b)
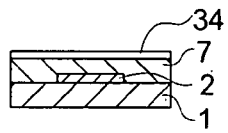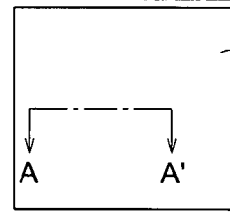
FIG. 6 (3a)  FIG. 6 (3b)
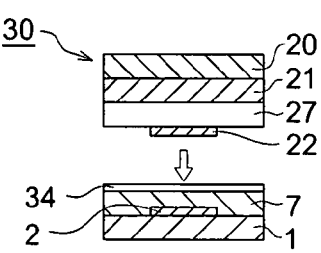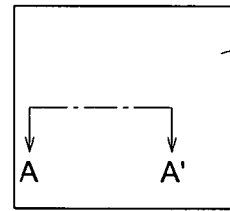
FIG. 6 (4a)  FIG. 6 (4b)
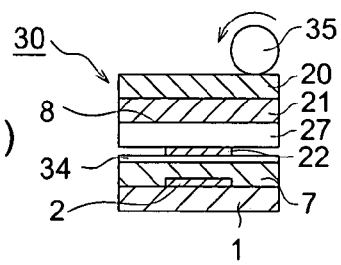
FIG. 6 (5a)
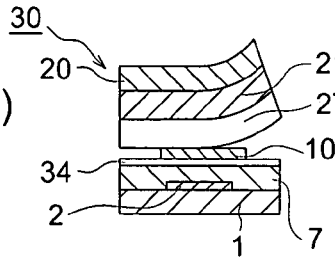
FIG. 6 (6a)
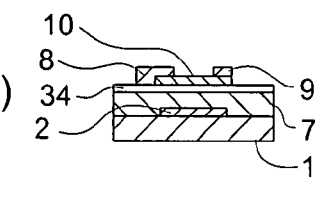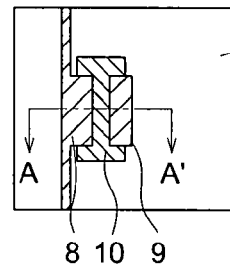
FIG. 6 (7a)  FIG. 6 (7b)

US 7,781,255 B2

DONOR SHEET AND METHOD OF MANUFACTURING DONOR SHEET AND ORGANIC THIN FILM TRANSISTOR

This application is based on Japanese Patent Application No. 2006-256925 filed on Sep. 22, 2006, and No. 2007-198706 filed on Jul. 31, 2007, in Japanese Patent Office, the entire content of which is hereby incorporated by reference.

TECHNICAL FIELD

The present invention relates to a donor sheet and method of manufacturing donor sheet and organic thin film transistor.

BACKGROUND

In the display method for liquid crystal display devices used in big screen televisions, passive matrix systems and active matrix systems are used, and the active matrix system is mainly used in applications requiring high image quality.

In the active matrix system, thin film transistors are connected to the individual pixels. Heretofore, the semiconductor layer of these thin film transistors are often formed of a-Si, but in the a-Si manufacturing process, because the vacuum process such as plasma CVD is used for forming a thin film, the process for film formation is complex and process management is difficult.

In order to solve these problems, much attention has been placed on the organic thin film transistor in which the semiconductor layer of the thin film transistor is formed of an organic semiconductor material. It has been proposed that the semiconductor layer of the organic thin film transistor is formed using a coating method such as the inkjet method or the spin coat method (For example refer to SID '02 Digest p 57). However, because the soluble organic semiconductor material that can be used in the coating methods have poor properties, there was a problem that sufficient thin film transistor properties could not be obtained.

In order to solve these types of problems, much attention has been given to the method which uses a semiconductor precursor. The semiconductor precursor is a substance which undergoes chemical changes when physical energy is applied and thereby becomes a semiconductor. There are some substances which do not dissolve in solvents in the semiconductor state, but dissolve in solvents in the precursor state. Known examples include precursors such as pentacene, oligothiophene, porphyrin which have excellent semiconductor properties. After these precursors are coated using a coating method, when the precursor is converted to the semiconductor, a semiconductor layer with excellent semiconductor properties can be formed by a simple process.

For example, a method has been proposed in which a photothermal conversion layer (combined with a gate insulation layer) is formed on a precursor that is formed on a glass substrate, and heat is generated in the photothermal conversion layer using heat from laser radiation, and the semiconductor precursor is thereby converted to a semiconductor (see Japanese Laid-Open Patent Publication No. 2004-146575).

However the organic thin film transistor element created by the method described in Japanese Laid-Open Patent Publication No. 2004-146575 was problematic in terms of reliability because the photothermal conversion layer remained on the substrate.

In addition, the properties of the thin film transistor depend to a large extent on the compatibility of the gate insulating layer and the semiconductor layer, but in the method described in the Japanese Laid-Open Patent Publication No. 2004-146575, it is necessary to select a material that has photothermal conversion functions as the gate insulating layer, and there are few options. For this reason, as the gate insulating layer and the semiconductor layer do not have excellent compatibility, sufficient properties as an organic thin film transistor element cannot be obtained.

Furthermore, after an electrode and the like are formed, the precursor is coated on the substrate and thus coating with a uniform film thickness was difficult. For this reason, in some case there was variation in the organic thin film transistor element properties.

SUMMARY

The present invention was conceived in view of the above problems, and a challenge thereof is to provide a donor sheet which is capable of transferring a semiconductor layer with excellent properties and a manufacturing method thereof as a well as method of manufacturing an organic thin film transistor with excellent properties and little variation in the properties.

In view of forgoing, one embodiment according to one aspect of the present invention is a method of manufacturing a donor sheet for transferring a transfer layer in a predetermined shape onto a receiving substrate, the method comprising the steps in the following order:

forming an organic semiconductor precursor layer on a substrate sheet by applying to the substrate sheet a solution in which an organic semiconductor precursor which converts to an organic semiconductor by being heated is resolved;

forming the transfer layer in the predetermined shape by heating the organic semiconductor precursor layer in the predetermined shape to convert the organic semiconductor precursor to an organic semiconductor; and removing an organic semiconductor precursor which is not converted to the organic semiconductor.

According to another aspect of the present invention, another embodiment is a donor sheet manufactured by a method comprising the steps in the following order:

forming an organic semiconductor precursor layer on a substrate sheet by applying to the substrate sheet a solution in which an organic semiconductor precursor which converts to an organic semiconductor by being heated is resolved;

forming the transfer layer in the predetermined shape by heating the organic semiconductor precursor layer in the predetermined shape to convert the organic semiconductor precursor to an organic semiconductor; and removing an organic semiconductor precursor which is not converted to the organic semiconductor.

According to another aspect of the present invention, another embodiment is a method of manufacturing an organic thin film transistor, which has on a substrate at least a source electrode, a drain electrode, an organic semiconductor layer connecting the source electrode and the drain electrode, a gate electrode, and a gate insulation layer between the organic semiconductor layer and the gate electrode, using a donor sheet and a receiving member which has the substrate on which at least the source electrode and the drain electrode are provided as an uppermost layer, the method comprising the steps in the following order:

laying the donor sheet on the receiving member in a direction in which a transfer layer of the donor sheet including an organic semiconductor contacts with the source electrode and the drain electrode of the receiving member;

heating the donor sheet; and separate the donor sheet and the receiving member,
wherein a method of manufacturing the donor sheet comprising the steps in the following order:
  forming an organic semiconductor precursor layer on a substrate sheet by applying to the substrate sheet a solution in which an organic semiconductor precursor which converts to an organic semiconductor by being heated is resolved;
  forming the transfer layer in the predetermined shape by heating the organic semiconductor precursor layer in the predetermined shape to convert the organic semiconductor precursor to an organic semiconductor; and
  removing an organic semiconductor precursor which is not converted to the organic semiconductor.

According to another aspect of the present invention, another embodiment is a method of manufacturing an organic thin film transistor, which has on a substrate at least a source electrode, a drain electrode, an organic semiconductor layer connecting the source electrode and the drain electrode, a gate electrode, and a gate insulation layer between the organic semiconductor layer and the gate electrode, using a donor sheet and a receiving member which has the substrate on which the gate electrode and, as an uppermost layer, the gate insulation layer are provided, the method comprising the steps in the following order:
  laying the donor sheet on the receiving member in a direction in which a transfer layer of the donor sheet including an organic semiconductor contacts with the gate insulation layer of the receiving member;
  heating the donor sheet; and
  separate the donor sheet and the receiving member,
  wherein a method of manufacturing the donor sheet comprising the steps in the following order:
    forming an organic semiconductor precursor layer on a substrate sheet by applying to the substrate sheet a solution in which an organic semiconductor precursor which converts to an organic semiconductor by being heated is resolved;
    forming the transfer layer in the predetermined shape by heating the organic semiconductor precursor layer in the predetermined shape to convert the organic semiconductor precursor to an organic semiconductor; and
    removing an organic semiconductor precursor which is not converted to the organic semiconductor.

According to another aspect of the present invention, another embodiment is a method of manufacturing an organic thin film transistor, which has on a substrate at least a source electrode, a drain electrode, an organic semiconductor layer connecting the source electrode and the drain electrode, a gate electrode, and a gate insulation layer between the organic semiconductor layer and the gate electrode, using a donor sheet and a receiving member which has the substrate on which the gate electrode and the gate insulation layer are formed in this order, and a water-repellent layer is provided as an uppermost layer, the method comprising the steps in the following order:
  laying the donor sheet on the receiving member in a direction in which a transfer layer of the donor sheet including an organic semiconductor contacts with the water-repellent layer of the receiving member;
  heating the donor sheet; and
  separate the donor sheet and the receiving member,
  wherein a method of manufacturing the donor sheet comprising the steps in the following order:
    forming an organic semiconductor precursor layer on a substrate sheet by applying to the substrate sheet a solution in which an organic semiconductor precursor which converts to an organic semiconductor by being heated is resolved;
    forming the transfer layer in the predetermined shape by heating the organic semiconductor precursor layer in the predetermined shape to convert the organic semiconductor precursor to an organic semiconductor; and
    removing an organic semiconductor precursor which is not converted to the organic semiconductor.

According to another aspect of the present invention, another embodiment is a method of manufacturing a donor sheet for transferring a transfer layer in a predetermined shape onto a receiving substrate, the method comprising the steps in the following order:
  forming a photothermal conversion layer on a substrate sheet;
  forming an organic semiconductor precursor layer by applying to the photothermal conversion layer a solution in which an organic semiconductor precursor which converts to an organic semiconductor by being heated is resolved;
  forming the transfer layer in the predetermined shape by applying to the organic semiconductor precursor layer a light beam in the predetermined shape to heat the organic semiconductor precursor layer in the predetermined shape by heat generated by the photothermal conversion layer and to convert the organic semiconductor to an organic semiconductor; and
  removing an organic semiconductor precursor which is not converted to the organic semiconductor.

According to another aspect of the present invention, another embodiment is a donor sheet manufactured by a method comprising the steps in the following order:
  forming a photothermal conversion layer on a substrate sheet;
  forming an organic semiconductor precursor layer by applying to the photothermal conversion layer a solution in which an organic semiconductor precursor which converts to an organic semiconductor by being heated is resolved;
  forming the transfer layer in the predetermined shape by applying to the organic semiconductor precursor layer a light beam in the predetermined shape to heat the organic semiconductor precursor layer in the predetermined shape by heat generated by the photothermal conversion layer and to convert the organic semiconductor to an organic semiconductor; and
  removing an organic semiconductor precursor which is not converted to the organic semiconductor.

According to another aspect of the present invention, another embodiment is a method of manufacturing an organic thin film transistor, which has on a substrate at least a source electrode, a drain electrode, an organic semiconductor layer connecting the source electrode and the drain electrode, a gate electrode, and a gate insulation layer between the organic semiconductor layer and the gate electrode, using a donor sheet and a receiving member which has the substrate on which at least the source electrode and the drain electrode are provided as an uppermost layer, the method comprising the steps in the following order:
  laying the donor sheet on the receiving member in a direction in which a transfer layer of the donor sheet including an organic semiconductor contacts with the source electrode and the drain electrode of the receiving member;
  heating the donor sheet; and
  separate the donor sheet and the receiving member, wherein a method of manufacturing the donor sheet comprising the steps in the following order:

forming a photothermal conversion layer on a substrate sheet;

forming an organic semiconductor precursor layer by applying to the photothermal conversion layer a solution in which an organic semiconductor precursor which converts to an organic semiconductor by being heated is resolved;

forming the transfer layer in the predetermined shape by applying to the organic semiconductor precursor layer a light beam in the predetermined shape to heat the organic semiconductor precursor layer in the predetermined shape by heat generated by the photothermal conversion layer and to convert the organic semiconductor precursor to an organic semiconductor; and removing an organic semiconductor precursor which is not converted to the organic semiconductor.

According to another aspect of the present invention, another embodiment is a method of manufacturing an organic thin film transistor, which has on a substrate at least a source electrode, a drain electrode, an organic semiconductor layer connecting the source electrode and the drain electrode, a gate electrode, and a gate insulation layer between the organic semiconductor layer and the gate electrode, using a donor sheet and a receiving member which has the substrate on which the gate electrode and, as an uppermost layer, the gate insulation layer are provided, the method comprising the steps in the following order:

laying the donor sheet on the receiving member in a direction in which a transfer layer of the donor sheet including an organic semiconductor contacts with the gate insulation layer of the receiving member;

heating the donor sheet; and separate the donor sheet and the receiving member, wherein a method of manufacturing the donor sheet comprising the steps in the following order:

forming a photothermal conversion layer on a substrate sheet;

forming an organic semiconductor precursor layer by applying to the photothermal conversion layer a solution in which an organic semiconductor precursor which converts to an organic semiconductor by being heated is resolved;

forming the transfer layer in the predetermined shape by applying to the organic semiconductor precursor layer a light beam in the predetermined shape to heat the organic semiconductor precursor layer in the predetermined shape by heat generated by the photothermal conversion layer and to convert the organic semiconductor precursor to an organic semiconductor; and removing an organic semiconductor precursor which is not converted to the organic semiconductor.

According to another aspect of the present invention, another embodiment is a method of manufacturing an organic thin film transistor, which has on a substrate at least a source electrode, a drain electrode, an organic semiconductor layer connecting the source electrode and the drain electrode, a gate electrode, and a gate insulation layer between the organic semiconductor layer and the gate electrode, using a donor sheet and a receiving member which has the substrate on which the gate electrode and the gate insulation layer are formed in this order, and a water-repellent layer is provided as an uppermost layer, the method comprising the steps in the following order:

laying the donor sheet on the receiving member in a direction in which a transfer layer of the donor sheet including an organic semiconductor contacts with the water-repellent layer of the receiving member;

heating the donor sheet; and separate the donor sheet and the receiving member, wherein a method of manufacturing the donor sheet comprising the steps in the following order:

forming a photothermal conversion layer on a substrate sheet;

forming an organic semiconductor precursor layer by applying to the photothermal conversion layer a solution in which an organic semiconductor precursor which converts to an organic semiconductor by being heated is resolved;

forming the transfer layer in the predetermined shape by applying to the organic semiconductor precursor layer a light beam in the predetermined shape to heat the organic semiconductor precursor layer in the predetermined shape by heat generated by the photothermal conversion layer and to convert the organic semiconductor precursor to an organic semiconductor; and removing an organic semiconductor precursor which is not converted to the organic semiconductor.

BRIEF DESCRIPTION OF THE DRAWINGS

FIGS. 1(1a)-1(3a) and 1(1b)-1(3b) are explanatory drawings for explaining the first embodiment of the method of manufacturing the donor sheet of the present invention.

FIGS. 2(1a)-2(5a) and 2(1b)-2(5b) are explanatory drawings for explaining the second embodiment of the method for manufacturing the donor sheet of the present invention.

FIGS. 3(1a)-3(7a), 3(1b)-3(4b) and 3(7b) are explanatory drawings for explaining the first embodiment of the method for manufacturing the organic thin film organic TFT of the present invention.

FIGS. 6(1a)-6(7a), 6(1b)-6(4b) and 6(7b) are explanatory drawings for explaining the second embodiment of the method for manufacturing the organic thin film organic TFT of the present invention.

DETAILED DESCRIPTION OF THE PREFERRED EMBODIMENT

Figure 4:
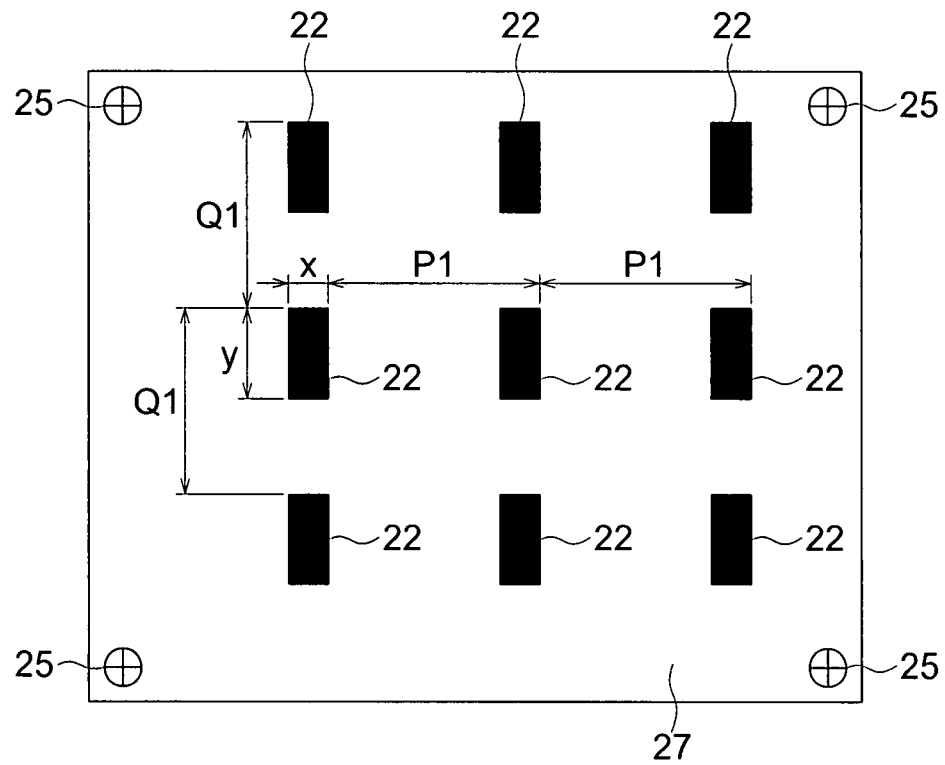
FIG. 4 is a plan view for describing an example of the donor sheet 30 on which plural pieces of transfer layers 22 are formed.

The following is a detailed description of the present invention using the embodiments, but the invention is not limited thereto.

FIGS. 1(1a)-1(3a) and 1(1b)-1(3b) are explanatory drawings for explaining the first embodiment of the method for manufacturing the donor sheet of the present invention. FIGS. 1(1a)-1(3a) and 1(1b)-1(3b) are used to describe in sequence the manufacturing method in which the organic semiconductor precursor layer 29 is formed on the substrate sheet 20, and the portion that is to be transferred is converted to a semiconductor to form the transfer layer 22, and then precursor that has not been converted to organic semiconductor is removed.

FIGS. 1(1b)-1(3b) show plan views when viewed from the upper surface of substrate sheet 20, and FIGS. 1(1a)-1(3a) is a cross-sectional view of substrate sheet 20 cut through cross section X-X' of FIGS. 1(1b)-1(3b).

The substrate sheet 20 functions as a support for the entire donor sheet 30 and is preferably a material with a high transmission factor for the wavelength of the light that is irradiated for photothermal conversion. For example, polyethylene terephthalate (PET), polyethylene naphthalate (PEN), polyethylene sulfone (PES) which are transparent polymer materials.

The following steps D10-D13 will be described as the first embodiment of the method for manufacturing the donor sheet of this embodiment.

D10 Step for forming the underlying layer 27.

D11 Step for forming the organic semiconductor precursor layer 29.

D12 Step for heating the portion of the organic semiconductor precursor layer 29 to be transferred.

D13 Step for removing the portion of the organic semiconductor precursor layer 29 that is not converted to semiconductor.

The following is a description of the steps in order.

D10 Step for Forming the Underlying Layer 27.

The underlying layer 27 is formed on the substrate sheet 20. As shown in FIG. 1(1*a*) the underlying layer 27 is formed on the substrate sheet 20. A cross-linking polyacrylate for example may be used as the material for forming the underlying layer 27 and film formation may be done using spin coating and the like.

The underlying layer 27 is a layer to facilitate peeling of the transfer layer 22 at the time of transfer, and this layer is formed if needed, thus this step may be omitted.

D11 Step for Forming Organic Semiconductor Precursor Layer 29.

In step D11, as shown in FIG. 1(1*a*) and FIG. 1(1*b*), organic semiconductor precursor layer 29 is formed on the entire surface of the substrate sheet 20.

In order to form a film using a coating method or a printing method, it is necessary to dissolve the organic semiconductor precursor in a solvent. Examples of the soluble organic semiconductor precursor that can be used include tetrabenzoporhyrin precursor, pentacene precursor, oligothiophene precursor, porphyrin precursor and the like.

The structural formula of the tetrabenzoporhyrin precursor and the structural formula of tetrabenzoporhyrin after conversion are shown below.

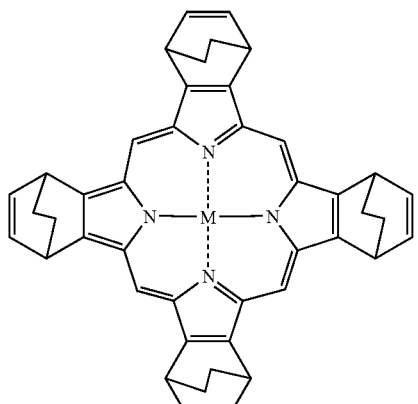

Tetrabenzoporhyrin precursor

[Formula 1]

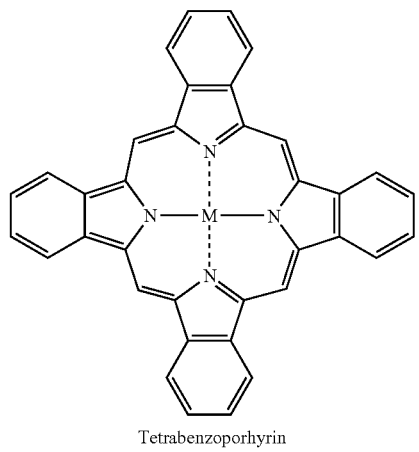

Tetrabenzoporhyrin

[Formula 2]

The structural formula of the pentacene precursor and the structural formula of pentacene after conversion are shown below.

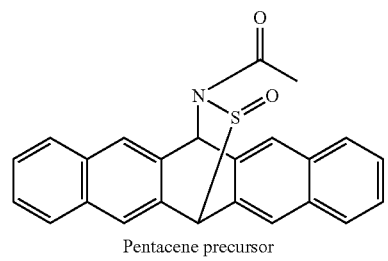

Pentacene precursor

[Formula 3]

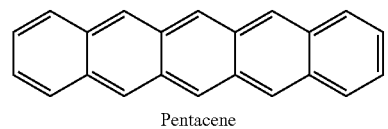

Pentacene

[Formula 4]

The structural formula of the oligothiophene precursor and the structural formula of oligothiophene after conversion are shown below.

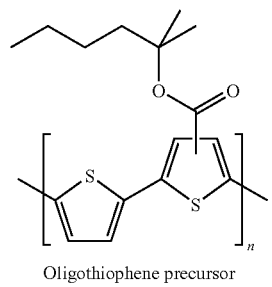

Oligothiophene precursor

[Formula 5]

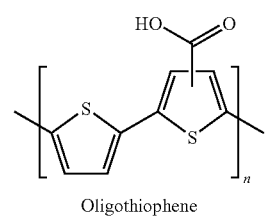

Oligothiophene

[Formula 6]

Organic solvents such as toluene, cyclohexane, m-dichlorobenzene, tetraline, chloroform and the like may suitably used with the precursor as the organic solvent for the organic semiconductor precursor.

Organic semiconductor precursor which has been dissolved in solvent may be used to form films using a generally known film formation method such as slit coating, screen printing or flexo printing. The thickness of the organic semiconductor precursor layer 29 for forming the film is preferably in the range of 10 nm-200 nm.

D12 Step for Heating the Portion of the Organic Semiconductor Precursor Layer 29 to be Transferred.

The portion remaining as the transfer layer 22 of the organic semiconductor precursor layer 29 is heated and converted to the organic semiconductor. In FIG. 1(2a), FIG. 1(2b), the example is shown in which the thermal head 50 is used for heating. The heat generating portion of the tip of the thermal head 50 is brought in contact with portion for transfer from the surface of the substrate sheet 20 which does not have the organic semiconductor precursor layer 29 formed, and the organic precursor layer is thereby converted into the organic semiconductor. In order to avoid deformation of substrate sheet 20 due to heat, the temperature of the applied heat is preferably 300° C. or less and the heating time is preferably about a few minutes. The thermal head 50 is moved sequentially in the direction of the arrow, and all of the portion remaining as the transfer layer 22 is converted to the organic semiconductor.

D13 Step for Removing the Organic Semiconductor Precursor Layer 29 that was not Converted To Semiconductor.

A solvent is used for removing the organic semiconductor precursor layer 29 that is not converted to semiconductor. The solvent may be the same solvent that is used in the Step D11.

FIG. 1(3a) and FIG. 1(3b) show the state after the organic semiconductor precursor layer 29 that is not converted to semiconductor is removed.

Next, the second embodiment in which the photothermal conversion layer is provided and light is irradiated on the photothermal conversion layer and the organic semiconductor precursor is converted to organic semiconductor. FIGS. 2(1a)-2(5a) and 2(1b)-2(5b) are explanatory drawings for describing the second embodiment of the method for manufacturing the donor sheet of the present invention. FIGS. 2(1a)-2(5a) and 2(1b)-2(5b) are used to describe in sequence the manufacturing method in which the photothermal conversion layer 21 is formed on the substrate sheet 20, and then light is irradiated on the photothermal conversion layer 21 formed on the underlying layer of the portion that is to become the transfer layer 22, and the transfer layer 22 is thereby formed.

FIGS. 2(1b)-2(5b) show plan views when viewed from the upper surface of substrate sheet 20, and FIGS. 2(1a)-2(5a) is a cross-sectional view of substrate sheet 20 cut through cross section X-X' of FIGS. 2(1b)-2(5b). The same material as the first embodiment may be used for the substrate sheet 20.

The following five steps will be described as an example of the method for manufacturing the donor sheet of the present invention. It is to be noted that detailed descriptions of the steps that are the same as the first example will be omitted.

D1 Step for forming photothermal conversion layer 21.

D10 Step for forming the underlying layer 27.

D11 Step for forming the organic semiconductor precursor layer 29.

D12 Step for heating the portion of the organic semiconductor precursor layer 29 to be transferred.

D13 Step for removing the portion of the organic semiconductor precursor layer 29 that is not converted to semiconductor.

The following is a description of the steps in order.

D1 Step for Forming Photothermal Conversion Layer 21.

In Step D1, as shown in FIG. 2(1a), FIG. 2(1b), the photothermal conversion layer 21 is formed on the entire surface of the substrate sheet 20. It is more preferable that the photothermal conversion layer 21 is formed after a thin film called an adhesion layer is formed on the substrate sheet 20 in order to improve adhesion of the photothermal conversion layer 21 to the surface of the substrate sheet 20.

A light absorbing material which absorbs the light of the wavelength that is irradiated and converts it to heat is used for the photothermal conversion layer 21. Carbon black, phthalocyanines, nickel diothylene, and oxides and sulfides of metals such as aluminum, chromium, gold and the like may be used as the light absorbing material. These light absorbing materials may be formed into particles with a size of 10 μm or less and dispersed in a binder.

Film forming polymers such as phenol resins, polyvinyl butyral resins, polyvinyl acetates, polyvinyl acetaroles, vinyledene polychlorides, polyacrylates, cellulose ethers, nitrocelloses, polycarbonates may be used as the binder.

The thickness of the photothermal conversion layer is preferably about 1 μm-10 μm to allow sufficient light absorption.

D10 Step for Forming the Underlying Layer 27.

The underlying layer 27 may be provided if necessary in order to suitably adjust the adhesion between the transfer layer 22 and the photothermal conversion layer 21 and facilitate the peeling of the transfer layer 22 at the time of transfer. As shown in FIG. 2(2a), FIG. 2(2b), the underlying layer 27 is formed on the substrate sheet 20 on which the photothermal conversion layer 21 is formed. A cross-linking polyacrylate for example may be used as the material for forming the underlying layer 27 and film formation may be done using spin coating and the like.

D11 Step for Forming Organic Semiconductor Precursor Layer 29.

In step D11, as shown in FIG. 2(3a) and FIG. 2(3b), organic semiconductor precursor layer 29 is formed on the entire surface of substrate sheet 20 using the same method as that of the first embodiment.

D12 Step for Heating the Portion of the Organic Semiconductor Precursor Layer 29 to be Transferred.

The portion to remain as the transfer layer 22 of the organic semiconductor precursor layer 29 is heated and converted to the organic semiconductor. In FIG. 2(4a), FIG. 2(4b), the example is shown in which light is irradiated and heating is performed. The light is irradiated on the portion for transfer as indicated by the arrow, from the surface of the substrate sheet 20 which does not have the organic semiconductor precursor layer 29 formed, and heat is generated in the photothermal conversion layer 21, and the organic semiconductor is thereby converted into the organic semiconductor.

Various types of lasers may be used as the light source. In the case using a laser, energy efficiency is excellent because light can be selectively irradiated only on the photothermal conversion layer 21. In addition, a method may be used in which a patterned mask is used, and light is irradiated from a xenon flash lamp or the like via the mask. In this case, the energy efficiency is poor, but this step can be completed in a short time, and this increases production efficiency.

D13 Step for Removing the Organic Semiconductor Precursor Layer 29 that is not Converted to Organic Semiconductor.

The organic semiconductor precursor layer 29 that is not converted to organic semiconductor is removed using the same method as that of the first embodiment.

FIG. 2(5a) and FIG. 2(5b) show the state after the organic semiconductor precursor layer 29 that is not converted to organic semiconductor is removed.

The steps described above are the steps for forming the donor sheet 30 in the second embodiment.

The donor sheet 30 of the first embodiment that is heated using the thermal head 50 has a simple structure and manufacturing cost is low. However, because the heat is applied by the thermal head 50 via the substrate sheet 20 of the donor sheet 30, heat tends to disperse through the substrate sheet 20 and high definition patterning of 300 dpi or more is difficult. On the other hand, in the second embodiment in which the heat conversion layer 21 is formed, a prescribed location can be heated with good precision by irradiating the laser light on the photothermal conversion layer 21, therefore, in the case where the transfer layer 22 is to be formed with high definition, the second embodiment is suitable.

Next, the method for manufacturing the organic thin film transistor (hereinafter, referred to organic TFT) in which an organic semiconductor layer 10 is formed using the donor sheet 30 of the present invention will be described. FIGS. 3(1a)-3(7a), 3(1b)-3(4b) and 3(7b) are explanatory diagrams of the first embodiment of the manufacturing method of the present invention.

FIGS. 3(1a)-3(7a), 3(1b)-3(4b) and 3(7b) explain in sequence the manufacturing method in which gate electrode 2 is provided on substrate 1, and then the gate insulating layer 7, source electrode 8 and drain electrode 9 are provided, and then bottom gate and bottom contact type organic TFT elements are formed which have the organic semiconductor layer 10.

FIG. 3(1b), FIG. 3(2b), FIGS. 3(3b), 3(4b) and 3(7b) are plan views of the substrate 1 viewed from above. FIG. 3(1a)-FIG. 3(3a) are cross-sectional views of each substrate 1 cut through cross section A-A' of FIGS. 3(1b)-1(3b). FIG. 3(4a)-FIG. 3(6a) are cross-sectional views of the substrate 1 through cross section A-A' and cross-sectional views of the donor sheet 30 cut through the corresponding position. In addition, FIG. 3(7a) is a cross-sectional view of the substrate 1 cut through cross section A-A' in FIG. 3(7b).

Next the steps S1-S15 are described as an example of the method for manufacturing the organic TFT of the present invention.

S1 Step for forming the gate electrode 2.
S2 Step for forming the gate insulating layer 7.
S3 Step for forming the water repellent layer 34.
S4 Step for forming the source electrode 8 and drain electrode 9.
S11 Step for laying the donor sheet 30 on the substrate 1.
S12 Step for heating the donor sheet 30.
S13 Step for separating the donor sheet 30 from the substrate 1.
S14 Step for heating the substrate 1.
S15 Step for removing the organic semiconductor precursor.

The following is a description of each of the steps in order.

S1 Step for Forming the Gate Electrode 2.

As shown in FIG. 3(1a) and FIG. 3(1b), the gate electrode 2 is formed on the substrate 1. In the present invention no particular limitations are imposed on the material for forming the substrate 1. For example, a flexible resin sheet or glass may be used. Various metal thin films may be used for the gate electrode 2. For example, low resistance materials such as Al, Cr, Au, Ag and laminates of these metals, or these materials having a doping of other material may be used in view of improving heat resistance of the metal thin film, improving adhesion to the support substrate and for preventing defects. In addition, transparent electrodes such as ITO, IZO, SnO and ZnO may be used. The manufacturing method may use a mask deposition method, a photolithography method, or various printing methods which are capable of patterning in a target configuration.

S2 Step for Forming the Gate Insulating Layer 7.

The gate-insulating layer 7 is formed as shown in FIG. 3(2a) and FIG. 3(2b).

The gate insulating layer 7 may be formed by a dry process such as deposition, sputtering, the CVD method, atmospheric pressure plasma method, and the like. No particular limitation is imposed on the material for the gate insulating layer 7, and various insulating films may be used. Examples of the inorganic materials that may be used include inorganic oxides such as silicon oxide, aluminum oxide, tantalum oxide, titanium oxide and the like and inorganic nitrides such as silicon nitride, aluminum nitride and the like. Examples of the organic materials that may be used include polyimide, polyamide, polyester, polyacrylate, photo radical polymer, and photo cation polymer based photocuring resins or copolymers including acryl nitryl components, polyvinyl phenols, polyvinyl alcohols, novolac resins, and cyanoethyl pullulan.

S3 Step for Forming the Water Repellent Layer 34.

The surface of the gate-insulating layer 7 is processed with hexamethyldisilazane (HMDS) or octadecyl trichlorosilane (OTS). After surface processing, the gate insulating layer 7 forms the water repellent layer 34 as shown in FIG. 3(3a) and FIG. 3(3b).

When the water repellent layer 34 is formed in this manner, the organic semiconductor of the transfer layer 22 that is transferred in subsequent step, and the molecules in the portion in contact with the water repellent layer 34 are in an aligned, state and an organic semiconductor layer 10 with good performance can be formed. It is preferable that the water repellent layer 34 is formed before the transfer layer 22 is formed, although this step is not essential.

It is to be noted that in this embodiment, the example is described in which the water repellent layer 34 is formed on the entire surface of the gate insulating layer 7, but the configuration is not limited to this example, and the organic semiconductor of the transfer layer 22 and water repellent layer 34 may come in contact with each other at some portions.

Also, the order for performing the step S3 for forming the water repellent layer 34 is not limited to being after the step S2, and may also be performed after Step S4 for forming the source electrode 8, drain electrode 9 which is described in the following. In this case, the water repellent layer 34 is also formed on the source electrode 8 and drain electrode 9, but the water repellent layer 34 is an extremely thin film and thus conduction between the organic semiconductor of the transfer layer 22 and the electrodes is not affected. In this case also, there is no need to form the water repellent layer 34 on the entire surface and the organic semiconductor of the transfer layer 22 may come in contact with the water repellent layer 34.

S4 Step for Forming Source Electrode 8 and Drain Electrode 9.

The source electrode 8 and the drain electrode 9 are formed as shown in FIG. 3(4a) and FIG. 3(4b).

A material which has good contact with the organic semiconductor layer 10 may be used as the source electrode 8 and the drain electrode 9. For example, Au and ITO are preferably used for pentacene. Films are formed using methods such as vacuum deposition and sputtering of these materials, and then patterning into the target configuration is performed using the photolithography method. Alternatively, the pattern of the source electrode 8 and the drain electrode 9 may be formed directly using various printing methods.

In the example of the donor sheet 30 described herein, plural pieces of transfer layers 22 are formed on the substrate sheet 20. FIG. 4 is a plan view for describing the example of the donor sheet 30 in which plural pieces of transfer layers 22 are formed. FIG. 4 shows the state in which nine pieces of transfer layers 22 having the same configuration are formed on the donor sheet 30. Those pieces of the transfer layers 22 have the same size and are arranged to be equally distant from each other. The x in FIG. 4 is the width of each piece of the transfer layers 22; y is the length of each piece of the transfer layers 22; P1 is the interval in the horizontal direction of each piece of the transfer layers 22; and Q1 is the interval in the vertical direction of each piece of the transfer layers 22. Numerals 25 are marker patterns for position alignment provided at the four corners of the photomask.

Figure 5:
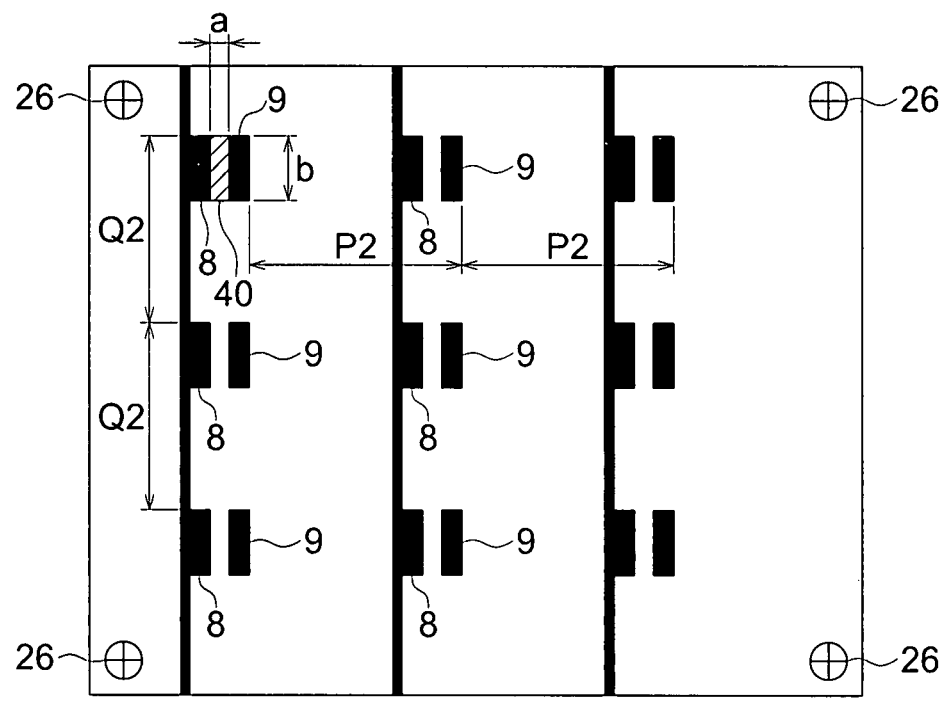
FIG. 5 is a plan view for describing the source electrode 8 and the drain electrode 9 formed in a matrix for producing multiple organic TFT elements on the substrate 1.

FIG. 5 is a plan view for describing the source electrode 8 and the drain electrode 9 formed in a matrix for producing multiple organic TFT elements on the substrate 1.

FIG. 5 shows an example with nine organic TFT elements of 3 rows×3 columns comprising a source electrode 8 and the drain electrode 9 formed on the substrate 1. The portion of 40 indicated by diagonal line between the source electrode 8 and the drain electrode 9 of FIG. 5 is the channel portion. The size of the channel portion 40 is width a and length b, and all of the organic TFT elements have the same size. The source electrodes 8 and the drain electrodes 9 are arranged with a horizontal interval P2 and a vertical interval Q2. The horizontal direction interval P2 and the vertical direction interval Q2 of the photothermal conversion layer 21 of the donor sheet 30 and the horizontal direction interval P2 and the vertical direction interval Q2 have the relationship P1=P2 and Q1=Q2. Numerals 26 in FIG. 5 show the marker patterns for position alignment.

In this manner, the source electrode 8 and drain electrode 9 comprising multiple organic TFT elements are formed.

Next, the step for forming the organic semiconductor layer 10 will be described. The step for forming the organic semiconductor layer 10 is performed in a sequence of steps including Step S11 for laying the donor sheet 30 on the substrate 1; the step S12 for heating the donor sheet 30 and the step S13 for separating the donor sheet 30 from the substrate 1.

It is to be noted that FIG. 3(4a)-FIG. 3(6a) show the donor sheet 30 of the second embodiment in which the photothermal conversion layer 21 is formed on the substrate sheet 20, but the configuration of the donor sheet 30 is not limited thereto, and the donor sheet 30 of the first embodiment which does not have the photothermal conversion layer 21 may be used. In addition, in FIG. 3(4a)-FIG. 3(6a), the underlying layer 27 is shown, but the donor sheet 30 is not limited to one which has the underlying layer 27, and thus the donor sheet 30 which does not have the underlying layer 27 may be used as necessary.

S11 Step for Laying the Donor Sheet 30 on the Substrate 1.

As shown in FIG. 3(4a) the donor sheet 30 is positioned at a position where the transfer layer 22 on the donor sheet 30 can electrically contact with the source electrode 8 and drain electrode 9 formed on substrate 1, and then, as shown in FIG. 3(5a), the donor sheet 30 is laid on the substrate 1.

For example, the patterning is done as follows. As shown in FIG. 4 and FIG. 5 when the marker pattern 26 of the substrate 1 and the marker pattern 25 of the donor sheet 30 are aligned and superposed, the transfer layer 22 is positioned just above the channel portion 40.

S12 Step for Heating the Donor Sheet 30.

The donor sheet 30 is heated and the transfer layer 22 is transferred to the channel portion 40. As shown in FIG. 3(5a), a heated roller 35 may be brought in contact with the donor sheet 30, and the donor sheet 30 is sequentially heated due to the rotation in the arrow direction by a driving device which is not shown.

In this manner by heating the donor sheet 30 using the roller 35, the transfer layer 22 is transferred onto the gate insulating layer 7, the source electrode 8 and drain electrode 9 on the substrate 1, and this becomes the organic semiconductor layer 10.

It is to be noted that the present invention does not depend on the principle of heat transfer. For example, the principle of heat transfer includes thermal adhesion transfer, ablation transfer and sublimation transfer, and the transfer may be based on any of these principles.

For example, in the thermal adhesion transfer localized heating occurs at the boundary between the thermal layer 22 and the photothermal conversion layer 21 and thus adhesion between the transfer layer 22 and the photothermal conversion layer 21 is reduced, while adhesion between transfer layer 22 and the portions on the substrate 1 is increased. As a result, after the donor sheet 30 is removed, the transfer layer 22 is still held on the substrate 1.

In ablation transfer, a portion of the transfer layer 22 is ablated by the heat generated at the photothermal conversion layer 21 and the substance that is ablated is held onto the substrate 1.

In sublimation transfer, the substances dispersed in the transfer layer 22 are sublimated by the heat generated at the photothermal conversion layer 21. A portion of the sublimated substances can be condensed on the substrate 1.

S13 Step for Separating the Donor Sheet 30 from the Substrate 1.

As shown in FIG. 3(6a), one end of the donor sheet 30 is lifted up and peeled from the substrate 1. The transfer layer 22 that is transferred to the substrate 1 side functions as the organic semiconductor layer 10. In this manner, the organic semiconductor layer 10 is formed as shown in FIG. 3(7a) and FIG. 3(7b).

S14 Step for Heating the Substrate 1.

In step S13, the substrate 1 in which the organic semiconductor layer 10 is formed is heated and the portion of the organic semiconductor layer 10 that has not yet been converted to semiconductor is converted and the properties are improved. The temperature for heating varies depending on the organic semiconductor material used in the donor sheet 30, but it is preferably a temperature above the temperature at which the organic semiconductor precursor changes to the organic semiconductor.

S15 Step for Removing the Organic Semiconductor Precursor.

The substrate 1 is immersed in the solvent for the organic semiconductor precursor used for the donor sheet 30, and the organic semiconductor precursor remaining on the substrate 1 is removed. The organic semiconductor precursor that is not needed is removed in this manner, and thus functional errors are reduced and highly reliable organic TFT elements can be prepared.

After step S15, a semiconductor protective layer is formed on the entire surface of the substrate 1. Deposition methods such as the atmospheric pressure plasma method, CVD method and the like and coating methods such as the spin coating method can be used as the method for forming the film of the semiconductor protective layer. In the case where the deposition methods are used for the material of the semiconductor protective layer, SiO$_2$ may be used, while for the spin coating methods Optomer-PC-403 which is a photosensitive acrylate material can be used.

Subsequently, a contact hole is formed for connecting the drain electrode 9 in the semiconductor protective layer, and a pixel electrode which connects with the contact hole is formed using the coating type ITO and formation of the organic TFT is complete.

It is to be noted that the present invention may also be used in the top gate type organic TFT.

In the method for manufacturing the top gate type organic TFT described below, the step for forming the gate insulating layer 7 and the step for forming the gate electrode are performed later, but aside from this as shown below, the order of the steps for forming the organic semiconductor layer 10 are not different from those described up until this point.

In this embodiment, the example for forming the water repellent layer 34 on the entire surface of the substrate 1 is described, but as in the case of the bottom gate type, it may be formed only on some portion, and the organic semiconductor of the transfer layer 22 and the water repellent layer 34 may come in contact at some portion.

In addition, the sequence for performing the step S3 for forming the water repellent layer 34 may also be performed after the Step S4 for forming the source electrode 8 and drain electrode 9 described below. In this case, the water repellent layer 34 is also formed on the source electrode 8 and drain electrode 9, but the water repellent layer 34 is an extremely thin film, and thus conducting between the organic semiconductor of the transfer layer 22 and the electrodes is not affected. In this case also, there is no need to form the water repellent layer 34 on the entire surface, and the organic semiconductor of the transfer layer 22 and the water repellent layer 34 may come in contact with each other.

S3 Step for forming the water repellent layer 34.
S4 Step for forming the source electrode 8 and the drain electrode 9.
S11 Step for laying the donor sheet 30 on the substrate 1.
S12 Step for heating the donor sheet 30.
S13 Step for separating the donor sheet 30 from the substrate 1.
S14 Step for heating the substrate 1.
S15 Step for removing the organic semiconductor precursor.
S2 Step for forming the gate insulating layer 7.
S1 Step for forming the gate electrode 2.

In this manner, after the step for forming the source electrode 8 and drain electrode 9 on the substrate 1 are performed, Steps S11, S12 and S13 are performed, and the organic semiconductor layer 10 is formed.

Next, the second embodiment of the method for manufacturing the organic TFT in which the organic semiconductor layer 10 is formed using the donor sheet 30 of the present invention will be described. The second embodiment is a manufacturing method for forming bottom gate and top contact type organic TFTs in which the gate electrode 2 is provided on the substrate 1, and the gate insulating layer 7 and the organic semiconductor layer 10 are formed, and then the source electrode 8 and drain electrode 9 are provided. The big difference between this and the first embodiment is only the order of the steps in which the steps forming the source electrode 8 and drain electrode 9 are performed after the step for forming the organic semiconductor layer 10, and thus the same numbers have been assigned to the same steps and descriptions thereof have been omitted.

FIGS. 6(1a)-6(7a), 6(1b)-6(4b) and 6(7b) are explanatory drawings for explaining the second embodiment of the method for manufacturing the organic TFT of the present invention. FIGS. 6(1a)-6(7a), 6(1b)-6(4b) and 6(7b) are used to describe the second embodiment in order.

FIGS. 6(1a)-6(7a), 6(1b)-6(4b) and 6(7b) are used to describe in sequence the manufacturing method in the case of forming the bottom gate and bottom contact type organic TFT elements in which the gate electrode 2 is provided on the substrate 1, and the gate insulating layer 7, the source electrode 8 and the drain electrode 9 are further provided, and then the organic semiconductor layer 10 is formed.

FIG. 6(1b), FIG. 6(2b), FIG. 6(3b), FIG. 6(4b) and FIG. 6(7b) are plan views from the upper surface of the substrate 1. FIG. 6(1a)-FIG. 6(3a) show cross-sectional views of each substrate 1 cut through cross section A-A' of FIGS. 6(1b)-6(3b). FIG. 6(4a)-FIG. 6(6a) are cross-sectional views of the substrate 1 through cross section A-A' and cross-sectional views of the donor sheet 30 cut through the corresponding position. In addition, FIG. 6(7a) is a cross-sectional view of the substrate 1 cut through cross section A-A' of FIG. 6(7b).

The following is a description of the steps which are the second embodiment.

S1 Step for Forming the Gate Electrode 2.

The gate electrode 2 is formed on the substrate 1 as shown if FIG. 6(1a) and FIG. 6(1b).

S2 Step for Forming the Gate Insulating Layer 7.

The gate-insulating layer 7 is formed as shown in FIG. 6(2a) and FIG. 6(2b).

S3 Step for Forming the Water Repellent Layer 34.

The water repellent layer 34 is formed as showing FIG. 6(3a) and FIG. 6(3b).

S11 Step for Laying the Donor Sheet 30 on the Substrate 1.

As shown if FIG. 6(4a), the donor sheet 30 is positioned such that the transfer layer 22 on the donor sheet 30 is at a prescribed position on the gate electrode 2, and the donor sheet 30 is laid on the water repellent layer 34 as shown in FIG. 6(5a).

S12 Step for Heating the Donor Sheet 30.

As shown in FIG. 6(5a), a heated roller 35, for example, may be brought in contact with the donor sheet 30, and the donor sheet 30 is sequentially heated due to the rotation in the arrow direction by a driving device which is not shown.

In this manner by heating the donor sheet 30 using the roller 35, the transfer layer 22 is transferred onto the gate insulating layer 7 on the substrate 1, and this becomes the organic semiconductor layer 10.

S13 Step for Separating the Donor Sheet 30 from the Substrate 1.

As shown in FIG. 6(6a), one end of the donor sheet 30 is lifted up and peeled from the substrate 1. The transfer layer 22 that is transferred to the substrate 1 side functions as the organic semiconductor layer 10.

S4 Step for Forming Source Electrode 8 and Drain Electrode 9.

The source electrode 8 and drain electrode 9 are formed as shown in FIG. 6(7a) and FIG. 6(7b).

A material which has good contact with the organic semiconductor layer 10 may be used for the source electrode 8 and the drain electrode 9. For example, Au and ITO are preferably used for pentacene. Films are formed vacuum deposition using a mask such that the semiconductor is not damaged. Alternatively, the pattern of the source electrode 8 and the drain electrode 9 may be formed directly using various printing methods.

Subsequently, a contact hole is formed in order to connect the drain electrode 9 in the semiconductor protective layer, and a pixel electrode which connects with the contact hole is formed using the coating type ITO and formation of the organic TFT is complete.

According to this embodiment, the organic semiconductor precursor which is coated on the donor sheet is heated, and the portion that is to be formed into the transfer layer is converted to a semiconductor, and thus a manufacturing method of a donor sheet which is capable of transferring a semiconductor layer with excellent properties, and the donor sheet, as a well as method for manufacturing an organic thin film transistor with excellent properties and little variation in the properties are provided.

EXAMPLES

The following is a description of examples for confirming the effects of the present invention, but the present invention is not to be limited by these examples.

Example 1 and Example 2

In Example 1 and Example 2 a donor sheet including a photothermal conversion layer is manufactured based on the second embodiment of the donor sheet manufacturing method. The prepared donor sheet is used to manufacture an 800×800 organic semiconductor element on a substrate. The following is described in the order of the step numbers described in the second embodiment of the donor sheet manufacturing method.

[Donor Sheet Preparation]

D1 Step for Forming the Photothermal Conversion Layer 21.

A photothermal conversion layer 21 having a thickness of 5 μm is formed of a material which uses phenol resin in which carbon black is dispersed using the vacuum deposition method on the substrate sheet 20 formed from polyethylene sulfon (PES) with a size of 150 mm×150 mm and thickness of 100 μm.

D10 Step for Forming the Underlying Layer 27.

The underlying layer 27 having a thickness of 5 μm is formed using the vacuum deposition method with crosslinked polyacrylate as the material.

D11 Step for Forming the Organic Semiconductor Precursor Layer 29.

A slit coater is used to coat a chloroform solution of the pentacene precursor onto the underlying layer 27. Subsequently this is dried for 3 minutes at 50° C. in a nitrogen environment to form the organic semiconductor precursor layer 29. The thickness of the organic semiconductor precursor layer 29 is 50 nm.

D12 Step for Heating the Portion of the Organic Semiconductor Precursor Layer 29 to be Transferred.

The portion to be remained as the transfer layer 22 of the organic semiconductor precursor layer 29 is heated and converted to the organic semiconductor. As shown in FIG. 2(4*a*) and FIG. 2(4*b*) the laser light is irradiated on the photothermal conversion layer 21 which contacts the portion to be transferred using a diode excited solid laser, from the surface of the substrate sheet 20 where the organic semiconductor precursor layer 29 is not formed. The laser light output is adjusted such that the surface of the portion to be converted to the organic semiconductor is heated at 200° C.

D13 Step for Removing the Organic Semiconductor Precursor Layer 29 that is not Converted to Organic Semiconductor.

The donor sheet 30 is immersed for a few minutes in the chloroform solution. Subsequently, it is dried for 3 minutes in a 50° C. environment.

In this manner, a donor sheet 30 is manufactured in which 800×800 pieces of transfer layers 22 of an organic semiconductor material are formed.

Next, an organic TFT element is manufactured based on the first embodiment of the organic TFT manufacturing method using the donor sheet including a photothermal conversion layer. The steps in Example 1 are performed under the exact conditions as Example 2 except for the step for forming the water repellent layer 34 which is Step S3. In Example 1, Step S3 is not performed while Step S3 is performed in Example 2.

The following is described in the order of the step numbers described in the first embodiment of the organic TFT manufacturing method.

[Organic TFT Preparation]

In this example a 150 mm×150 mm polyether sulfon (PES) substrate manufactured by Sumitomo-Bakeright in which a 130 nm Al film is formed on the surface as a conductive thin film, is used as the substrate 1 and an 800×800 bottom gate and bottom contact type organic thin film transistors are formed on the substrate 1, and their performances are checked.

S1 Step for Forming the Gate Electrode 2.

A resist with a thickness of approximately 1 μm is formed on the conductive thin film of substrate 1 and exposed to light via the photomask, and development is performed, and then the Al film is etched. Next, the resist layer is removed, and the gate electrode 2 is formed. In this example a photomask is used which has a pattern of gate electrodes 2 in an 800×800 matrix with vertical and horizontal interval of 170 μm.

S2 Step for Forming the Gate Insulating Layer 7.

TEOS (tetraethoxysilane) gas is used to form a 300 nm SiO2 film on the substrate 1 using the plasma CVD method, and this is used as the gate insulating layer 7.

S3 Step for Forming the Water Repellent Layer 34.

In Example 2, OTS processing is performed on the gate insulating layer 7 surface.

S4 Step for Forming the Source Electrode 8 and the Drain Electrode 9.

Next, after cleaning, a 100 nm tin doped indium oxide film (ITO) is formed on the gate insulating layer using the sputtering method, and after resist coating, a photomask with a reversed pattern of the source electrode 8 and the drain electrode 9 is used for light exposure, and development is performed, and then the ITO film is etched. Next, the resist layer is removed, and the source electrode 8 and the drain electrode 9 are formed. In this embodiment a photomask is used which has the pattern of the source electrode 8 and the drain electrode 9 in an 800×800 matrix with an interval of 170 μm. The width a of the channel portion 40 is 10 μm and the length b is 100 μm.

In addition, a photomask which has marker patterns for alignment at the four corners are used, and exposure development and etching is performed, and then the marker patterns 26 of the ITO film are formed on the gate insulating layer 7.

S11 Step for Laying the Donor Sheet 30 on the Substrate 1.

The positions of the marker pattern 25 of the donor sheet 30 manufactured in Steps D1-D5 and the marker pattern 26 provided in Step S4 are aligned, and the substrate sheet 20 and the substrate 1 are closely contacted.

S12 Step for Heating the Donor Sheet 30.

The donor sheet 30 is heated and applied with pressure using the roller 35 with a diameter of 10 cm and length of 15 cm in a nitrogen environment. The temperature of the roller 35 is 200° C., and the pressure applied was 20 gf/mm$^2$. The movement speed of the roller 35 is 10 mm/second, and the entire surface of the donor sheet 30 is heated sequentially.

S13 Step for Separating the Donor Sheet 30 from the Substrate 1.

The donor sheet 30 is separated from the substrate 1.

S14 Step for Heating the Substrate 1.

The substrate 1 is heated for 10 minutes at 220° C.

S15 Step for Removing the Organic Semiconductor Precursor.

The substrate 1 is immersed in a chloroform solution for a few minutes subsequently dried for 3 minutes at 50° C.

After this, contact holes for connecting the drain electrode 9 are formed in the semiconductor protective layer, and the pixel electrodes which connect with the contact holes are formed using the coating type ITO, and the formation of 640,000 organic TFT elements is completed.

In this manner the bottom gate and bottom contact type organic TFT elements are manufactured using the donor sheet of the present invention.

[Experimental Results]

Organic TFT elements are manufactured as a Comparative Example using the manufacturing method disclosed in Japanese Laid-Open Patent Publication No. 2004-146575. The experimental results for the organic TFTs manufactured using Example 1 and Comparative Example are shown in Table 1.

TABLE 1

| | Immediately after preparation | | 1 month later | |
| --- | --- | --- | --- | --- |
| | Average of mobility (cm$^2$/Vs) | Variation range of mobility | Average of mobility (cm$^2$/Vs) | Variation range of mobility |
| Example 1 | 0.2 | ±20% (0.16-2.4) | 0.19 | ±20% (0.15-2.3) |
| Comparative Example | 0.1 | ±99% (0.001-0.2) | 0.05 | ±99% (0.001-0.1) |

As shown in Table 1, the average of mobility in Example 1 immediately after manufacture is twice as high as that of Comparative Example and variation is extremely low. In the comparison, one month after manufacture, the average degree of movement in Comparative Example deteriorates to approximately ½, while in Example 1, deterioration is only about 5%. This shows that the organic semiconductor layer 10 prepared by the manufacturing method of Example 1 is more homogenous than that prepared by the manufacturing method of Comparative Example.

This shows that highly reliable organic TFT element in which the properties are excellent, and there is little variation, can be prepared in this example.

Table 2 is a comparison of the properties of the organic TFT elements of Example 1 and Example 2.

TABLE 2

| | Immediately after preparation | |
| --- | --- | --- |
| | Average of mobility (cm$^2$/Vs) | Variation range of mobility |
| Example 1 | 0.2 | ±20% (0.16-0.24) |
| Example 2 | 0.22 | ±20% (0.18-0.26) |

As shown in Table 2, the average of mobility in Example 2 immediately after manufacture is 10% higher than that of Example 2, and variation is about the same. this shows that when the water repellent layer is formed, organic TFT elements with more excellent properties can be formed.

Example 3

In Example 3, a donor sheet with no photothermal conversion layer is prepared based on the first embodiment of the donor sheet manufacturing method. The donor sheet prepared thereby is used to prepare 800 height×800 width organic semiconductor elements on the substrate.

[Preparation of Donor Sheet]

D10 Step for Preparing the Underlying Layer 27.

The underlying layer 27 having a thickness of 5 μm is formed on the substrate sheet 20 formed of polyethylene sulfon having a size of 150 mm×150 mm and thickness of 100 μm using the vacuum deposition method with cross-linked polyacrylate as the material.

D11 Step for Forming the Organic Semiconductor Precursor Layer 29.

A slit coater was used to coat a chloroform solution of the pentacene precursor onto the underlying layer 27. Subsequently this was dried for 3 minutes at 50° C. in a nitrogen environment to form the organic semiconductor precursor layer 29. The thickness of the organic semiconductor precursor layer 29 was 50 nm.

D12 Step for Heating the Portion of the Organic Semiconductor Precursor Layer 29 to be Transferred.

The portion to be transferred is sequentially heated for 3 minutes at a surface temperature of 200° C. for 3 minutes by bringing the heat-generating portion of the tip of the thermal head 50 in contact with the substrate sheet 20 as shown in FIG. 1(2*a*).

D13 Step for Removing the Portion of the Organic Semiconductor Precursor Layer 29 that is not Converted to Semiconductor.

The donor sheet 30 is immersed for a few minutes in the chloroform solution. Subsequently, it is dried for 3 minutes in a 50° C. environment.

In this manner, the sheet 30 is prepared in which 800×800 pieces of transfer layers 22 are formed.

[Preparation of Organic TFT]

In this example, 800×800 top contact organic thin film transistors are prepared using donor sheets 30 which do not have photothermal conversion layer that was formed, and performances of the transistors were checked. The preparation of the organic TFT is the same as the steps of Example 1. The steps are performed under the exact conditions as Example 1 except that the donor sheet which does not have the photothermal conversion layer is used, and thus detailed descriptions thereof have been omitted.

[Experimental Results]

The results of the experiments in which the performance of the organic TFT elements prepared in Example 1 and the organic TFT elements prepared in Example 3 are compared, are shown in Table 3.

TABLE 3

| | Immediately after preparation | | 1 month later | |
|---|---|---|---|---|
| | Average of mobility ($cm^2/Vs$) | Variation range of mobility | Average of mobility ($cm^2/Vs$) | Variation range of mobility |
| Example 1 | 0.2 | ±20% (0.16-2.4) | 0.19 | ±20% (0.15-2.3) |
| Example 3 | 0.2 | ±20% (0.16-2.4) | 0.19 | ±20% (0.15-2.3) |

As is clear from Table 3, the organic TFT elements prepared in Example 3 show substantially the same performance as the organic TFT elements prepared in Example 1. Thus, it is clear that in this Example also highly reliable organic TFT elements with uniform good performance can be prepared.

It is to be noted that in this Example, the case where the sheet to sheet method is used and the transfer layer 22 including an organic semiconductor material is transferred from the donor sheet 30, is described, but the present invention is not limited to the sheet to sheet method, and other methods such as the roll to roll method, the roll to sheet method, and the sheet to roll method may be suitably used.

As described above according to the present invention a donor sheet manufacturing method that is capable of transferring a semiconductor layer with excellent properties, and the resulting donor sheet as well as a manufacturing method for an organic thin film transistor that has excellent properties and little variation are provided.

What is claimed is:

1. A method of manufacturing a donor sheet for transferring a transfer layer of an organic semiconductor in a predetermined shape onto a receiving substrate, the method comprising the steps in the following order:

forming an organic semiconductor precursor layer on a substrate sheet by applying to the substrate sheet a solution comprising an organic semiconductor precursor which converts to the organic semiconductor by being heated;

heating the organic semiconductor precursor layer in the predetermined shape to convert a heated organic semiconductor precursor layer to the transfer layer of the organic semiconductor in the predetermined shape; and removing the organic semiconductor precursor which is not converted to the organic semiconductor.

2. The method of claim 1, wherein in the step of removing the organic semiconductor precursor, the organic semiconductor precursor which is not converted to the organic semiconductor is removed by an organic solvent.

3. A method of manufacturing an organic thin film transistor, which has on a substrate at least a source electrode, a drain electrode, an organic semiconductor layer connecting the source electrode and the drain electrode, a gate electrode, and a gate insulation layer between the organic semiconductor layer and the gate electrode, using a donor sheet and a receiving member which has the substrate on which at least the source electrode and the drain electrode are provided as an uppermost layer, the method comprising the steps in the following order:

laying the donor sheet on the receiving member in a direction in which a transfer layer of the donor sheet including an organic semiconductor contacts with the source electrode and the drain electrode of the receiving member;

heating the donor sheet; and separating the donor sheet and the receiving member;

wherein a method of manufacturing the donor sheet comprising the steps in the following order:

forming an organic semiconductor precursor layer on a substrate sheet by applying to the substrate sheet a solution comprising an organic semiconductor precursor which converts to the organic semiconductor by being heated;

heating the organic semiconductor precursor layer in a predetermined shape to convert a heated organic semiconductor precursor layer to the transfer layer of the organic semiconductor in the predetermined shape; and removing the organic semiconductor precursor which is not converted to the organic semiconductor.

4. The method of claim 3, wherein the receiving member is provided, as the uppermost layer, with the source electrode, the drain electrode and a water-repellent layer.

5. The method of claim 3, comprising the step of:

heating the transfer layer which has been transferred onto the receiving member after the step of separating the donor sheet and the receiving member.

6. The method of claim 3, comprising the step of:

removing the organic semiconductor precursor by an organic solvent after the step of separating the donor sheet and the receiving member.

7. A method of manufacturing an organic thin film transistor, which has on a substrate at least a source electrode, a drain electrode, an organic semiconductor layer connecting the source electrode and the drain electrode, a gate electrode, and a gate insulation layer between the organic semiconductor layer and the gate electrode, using a donor sheet and a receiving member which has the substrate on which the gate electrode and, as an uppermost layer, the gate insulation layer are provided, the method comprising the steps in the following order:

laying the donor sheet on the receiving member in a direction in which a transfer layer of the donor sheet including an organic semiconductor contacts with the gate insulation layer of the receiving member;

heating the donor sheet; and separating the donor sheet and the receiving member;

wherein a method of manufacturing the donor sheet comprising the steps in the following order:

forming an organic semiconductor precursor layer on a substrate sheet by applying to the substrate sheet a solution comprising an organic semiconductor precursor which converts to the organic semiconductor by being heated;

heating the organic semiconductor precursor layer in a predetermined shape to convert a heated organic semiconductor precursor layer to the transfer layer of the organic semiconductor in the predetermined shape; and removing the organic semiconductor precursor which is not converted to the organic semiconductor.

8. A method of manufacturing an organic thin film transistor, which has on a substrate at least a source electrode, a drain electrode, an organic semiconductor layer connecting the source electrode and the drain electrode, a gate electrode, and a gate insulation layer between the organic semiconductor layer and the gate electrode, using a donor sheet and a receiving member which has the substrate on which the gate electrode and the gate insulation layer are formed in this order, and a water-repellent layer is provided as an uppermost layer, the method comprising the steps in the following order:

laying the donor sheet on the receiving member in a direction in which a transfer layer of the donor sheet including an organic semiconductor contacts with the water-repellent layer of the receiving member;

heating the donor sheet; and separating the donor sheet and the receiving member;

wherein a method of manufacturing the donor sheet comprising the steps in the following order:

forming an organic semiconductor precursor layer on a substrate sheet by applying to the substrate sheet a solution comprising an organic semiconductor precursor which converts to the organic semiconductor by being heated;

heating the organic semiconductor precursor layer in a predetermined shape to convert a heated organic semiconductor precursor layer to the transfer layer of the organic semiconductor in the predetermined shape; and removing the organic semiconductor precursor which is not converted to the organic semiconductor.

* * * * *